(12) United States Patent
Wieczorek et al.

(10) Patent No.: US 6,274,894 B1
(45) Date of Patent: Aug. 14, 2001

(54) LOW-BANDGAP SOURCE AND DRAIN FORMATION FOR SHORT-CHANNEL MOS TRANSISTORS

(75) Inventors: Karsten Wieczorek, Boxdorf; Manfred Horstmann, Dresden, both of (DE); Frederick N. Hause, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/375,920

(22) Filed: Aug. 17, 1999

(51) Int. Cl.[7] ............. H01L 31/072; H01L 31/109; H01L 31/0328; H01L 31/0336; H01L 29/04

(52) U.S. Cl. ............. 257/192; 257/63; 257/616; 257/607; 438/285

(58) Field of Search ............. 257/63, 65, 192, 257/616, 607; 438/285, 287

(56) References Cited

U.S. PATENT DOCUMENTS

| | | | |
|---|---|---|---|
| 5,216,271 | * | 6/1993 | Takagi et al. ............ 257/370 |
| 5,285,088 | * | 2/1994 | Sato et al. ............ 257/192 |
| 5,432,366 | * | 7/1995 | Banerjee et al. ............ 257/327 |
| 5,569,624 | * | 10/1996 | Weiner ............ 438/285 |
| 5,955,745 | * | 9/1999 | Yamazaki ............ 257/63 |
| 6,048,756 | * | 4/2000 | Lee et al. ............ 438/151 |

FOREIGN PATENT DOCUMENTS 7-94717 * 4/1995 (JP).

* cited by examiner

Primary Examiner—Mahshid Saadat
Assistant Examiner—Allan R. Wilson
(74) Attorney, Agent, or Firm—Kevin L. Daffer; Conley, Rose & Tayon

(57) ABSTRACT

A transistor having source and drain regions which include lower-bandgap portions and a method for making the same are provided. A gate conductor is formed over a gate dielectric on a semiconductor substrate. The gate conductor is covered on all sides with oxide or another dielectric for protection during subsequent processing. Anisotropic etching is used to form shallow trenches in the substrate on either side of the gate conductor. The trenches are bounded by the dielectric-coated gate conductor and by dielectric isolation regions, or by an adjacent gate conductor in the case of non-isolated transistors. A selective epitaxy technique may then be used to grow a layer within each trench of a material having a bandgap lower than that of the semiconductor substrate. The lower-bandgap material is preferably grown only on the exposed semiconductor surfaces in the trenches, and not on the surrounding dielectric regions. The lower-bandgap material may be an undoped layer used as a buffer for interdiffusion of dopants between the channel and source/drain regions of the transistor. The lower-bandgap material may also be a heavily doped layer with the same carrier type as the semiconductor substrate, used as a halo region to reduce punchthrough and threshold voltage lowering effects. The buffer and halo functions may also be combined using multilayer source/drain structures. The portion of the trench above such buffer and/or halo layers is filled with a semiconductor material doped with the opposite carrier type than that of the substrate to form lightly-doped-drain portions of the transistor source and drain.

18 Claims, 5 Drawing Sheets

LOW-BANDGAP SOURCE AND DRAIN FORMATION FOR SHORT-CHANNEL MOS TRANSISTORS

BACKGROUND OF THE INVENTION

1. Field of the Invention

This invention relates to integrated circuit fabrication and, more particularly, to short-channel transistor source and drain regions which are less susceptible to diffusion and allow improved control over transistor characteristics, and a method for fabricating these source and drain regions.

2. Description of the Relevant Art

Fabrication of a metal-oxide-semiconductor (MOS) integrated circuit involves numerous processing steps. A gate dielectric, typically formed from silicon dioxide ("oxide"), is formed on a semiconductor substrate which is doped with either n-type or p-type impurities. For each MOS field effect transistor (MOSFET) being formed, a gate conductor is formed over the gate dielectric, and dopant impurities are introduced into the substrate to form a source and drain. The channel of the transistor is located under the gate dielectric, between the source and drain. A pervasive trend in modern integrated circuit manufacture is to produce transistors having feature sizes as small as possible. Many modern day processes employ features, such as gate conductors and interconnects, which have less than 0.3 μm critical dimension. As feature size decreases, the sizes of the resulting transistor and the interconnect between transistors also decrease. Fabrication of smaller transistors allows more transistors to be placed on a single monolithic substrate, thereby allowing relatively large circuit systems to be incorporated on a single, relatively small die area.

Such feature size reduction can place severe demands on reliable operation of the resulting transistors. For example, reduction in the transistor gate length can result in very high electric fields at the drain end of the transistor channel, unless the drain-to-source voltage used in operating the transistor is reduced by a corresponding amount. High electric fields can give rise to undesirable "hot carrier" effects in transistors, including avalanche breakdown at the drain/substrate junction and injection of carriers into the gate dielectric. These hot-carrier effects are typically mitigated by the use of dielectric sidewall spacers adjacent to sidewalls of the gate conductor. A relatively shallow impurity distribution, known as a lightly-doped drain (LDD) distribution, is first ion-implanted into the substrate using the gate conductor as a mask. The dielectric sidewall spacers are then formed, such that LDD portions adjacent the channel region are covered by the sidewall spacers. A deeper and somewhat more heavily doped impurity distribution is then implanted into the substrate using the gate conductor and sidewall spacers as a mask.

A cross-sectional view of an idealized MOSFET structure using LDD regions in the source and drain is shown in FIG. 1. Gate conductor 14 is formed over gate dielectric 12 on semiconductor substrate 10. LDD portions 18 are formed within substrate 10 before formation of dielectric sidewall spacers 16. Deep source/drain portions 20 are formed by implantation into substrate 10, aligned to sidewalls of spacers 16. Portions 18 and 20 are of opposite impurity type than substrate 10. For an n-channel transistor, for example, portions 18 and 20 are n-type, while substrate 10 is p-type. The doping of LDD portions 18 is somewhat lower than that of portions 20, resulting in a lowered electric field associated with the p-n junction at the drain end of the MOSFET channel, thereby reducing the severity of hot-carrier effects. Furthermore, the small junction depth of LDD portions 18 reduces encroachment into the channel of the depletion region associated with the drain/channel p-n junction. This reduced depletion region encroachment may minimize other undesirable effects associated with short-channel transistors, as discussed in more detail below. The heavier doping and deeper extent of source/drain portions 20 aids in making contact to the source/drain regions.

A more realistic representation of a MOSFET with LDD regions is shown in FIG. 2. The transistor of FIG. 2 differs from that of FIG. 1 in that LDD portions 18 are partially below gate conductor 14, rather than being aligned under spacers 16. In addition, source/drain portions 20 are partially below spacers 16, rather than being aligned outside of spacers 16. This change in the position of portions 18 and 20 from the as-implanted distributions is a result of diffusion of the implanted impurities during the subsequent fabrication steps. The speed and extent of this diffusion is enhanced by the presence of structural defects introduced into substrate 10 during ion implantation of portions 18 and 20. Such defect-enhanced diffusion is also referred to as "transient-enhanced diffusion" (TED), wherein defects or other incidences of nonuniform structure (such as doping nonuniformities) are termed "transients". The movement of source/drain portions 18 and 20 undesirably decreases the effective length of the channel to a value smaller than that defined by the length of gate conductor 14. Furthermore, the defect-enhanced diffusion of portions 18 and 20 may not occur in a reliable, repeatable way, making predictable device fabrication difficult.

An additional problem associated with the overlap of gate conductor 14 and LDD portions 18 in FIG. 2 is an increased overlap capacitance between the gate and the source or drain. This overlap capacitance, along with other capacitances and resistances associated with the transistor structure, contributes to an RC time constant which characterizes delays associated with signal propagation through a transistor circuit. Fabrication of a circuit with increased RC time constants lowers the speed at which the circuit can operate by increasing the time needed, for example, for a circuit output voltage to respond to a change in input voltage. The undesirable diffusion of LDD portions 18 into the channel of the transistor of FIG. 2 can be reduced somewhat by keeping the doping of LDD portions 18 relatively low. However, this places an undesirable constraint on the doping of the LDD regions. The term "lightly-doped drain" implies a low doping in the LDD regions, and this has been the case historically. In current high-performance MOSFETs, however, the "LDD" region doping level is often within an order of magnitude of the doping level of the deep, heavily-doped source/drain portions. This increased LDD doping level reduces the series resistance of the LDD region, thereby increasing the transistor drive current. Lowering the doping level of the LDD region to mitigate the defect-enhanced diffusion of ion-implanted LDD regions may therefore increase the LDD series resistance and lower the transistor drive current.

In addition to the hot-carrier effects described above, other undesirable effects are associated with reduced feature sizes, and particularly shortened channel lengths, in MOSFETs. Some of these short-channel effects are associated with encroachment into the channel area of depletion regions from the drain/channel and source/channel p-n junctions. High electric fields within the drain/channel depletion region are associated with the hot-carrier effects described above. Under some conditions in a short-channel device, the depletion regions associated with the source/channel and drain/channel junctions may actually become joined in an area below the transistor channel. This joining of depletion regions, known as "punchthrough", creates a path for drift of carriers from the source to the drain other than the intended transistor channel, and can lead to a loss of control of the channel by the transistor gate. Another short-channel effect related to the drain/channel and source/channel depletion regions is threshold voltage reduction, described in more detail below.

Feature size reduction drives a reduction of overall transistor dimensions and operating voltages known as "scaling". As gate conductor widths decrease, for example, other device dimensions must also decrease in order to maintain proper device operation. Early MOSFET scaling techniques involved decreasing all dimensions and voltages by a constant scaling factor, to maintain constant electric fields in the device as the feature size decreased. This approach has given way to more flexible scaling guidelines which account for operating characteristics of short-channel devices (devices having channel lengths less than about 1 micron). For example, a maximum value of MOSFET subthreshold current can be maintained while feature sizes shrink, by decreasing any or all of several quantities, including gate oxide thickness, operating voltage, depletion width, and junction depth, by appropriate amounts.

For scaling to submicron feature sizes, device dimensions and voltages are generally not each decreased by the same factor. One dimension which has been steadily decreasing, for example, is gate oxide thickness. A major factor driving reduction of gate oxide thickness is the increased transistor drain current realized for a reduced gate dielectric thickness. Higher transistor drain currents are desirable because they allow each transistor to drive a greater number of other transistors, and can result in increased switching speeds. A device parameter which has not decreased significantly in conjunction with feature size reduction, on the other hand, is device threshold voltage, $V_T$. MOSFET $V_T$ has been relatively constant at about 0.7 volts (or slightly less), and is projected to remain at about this value as feature sizes continue to decrease. A decrease in threshold voltage below this value may be undesirable because subthreshold leakage current for zero gate voltage (in the case of an enhancement-mode transistor) is increased as threshold voltage is decreased. The design value of $V_T$ has therefore remained relatively constant, and device scaling has involved reduction of other quantities, such as junction depth and supply voltage, by varying amounts.

Maintaining a particular design value of $V_T$ as channel lengths decrease, however, presents certain challenges. For a given oxide thickness and substrate doping, $V_T$ tends to decrease as channel length decreases, for channel lengths smaller than about 2 microns. As used herein, a decrease in $V_T$ refers to a $V_T$ which becomes less positive or more negative in the case of an n-channel device, or a $V_T$ which becomes less negative or more positive in the case of a p-channel device. This decrease in $V_T$ occurs because the effect of the source and drain depletion regions on the charge controlled by the gate becomes increasingly important as channel length decreases. An exemplary enhancement-mode MOSFET biased into inversion is shown in FIG. 3. Gate dielectric 12 and gate conductor 14 are formed upon semiconductor substrate 10, while source 24 and drain 22 are formed within substrate 10 on either side of gate conductor 14. Before free charge in inversion region 26 is induced by a voltage applied to gate conductor 14, a depletion region 28 (having a boundary marked with a short-dashed line) is formed in substrate 10 below gate dielectric 12. The threshold voltage $V_T$ which must be applied to gate 14 to turn on the transistor includes the voltage needed to establish depletion region 28 and that needed to induce the carriers in inversion region 26.

As shown in FIG. 3, parts of depletion region 28 are formed by drain depletion region 30 arising from the drain-to-substrate junction and source depletion region 32 arising from the source-to-substrate junction. Boundaries of source and drain depletion regions 32 and 30 are marked by long-dashed lines in FIG. 3. This leaves only the charge in shaded depletion region 34 to be induced by the gate voltage, which reduces the voltage needed to turn on the transistor as compared to that predicted using depletion region 28. For given doping levels and oxide thickness, $V_T$ decreases as the channel length decreases because the fraction of the depletion region under the channel which is contributed by the source and drain regions becomes larger with decreasing channel length.

One possible way to counteract both the decrease in $V_T$ and the possibility of punchthrough as channel length is decreased is to use a higher background channel doping level for short-channel devices. In the case of an n-channel device, for example, the substrate doping in the channel region would be made more p-type. A higher voltage would then be needed to create an inversion layer and turn on the transistor. A drawback to this approach is that higher doping levels in the channel region result in decreased carrier mobility, and thereby reduced transistor drive current. Furthermore, increasing the channel doping enough to prevent punchthrough may result in an increase in $V_T$ above its design value. Such a $V_T$ increase may also undesirably reduce transistor drive current.

An alternative approach is to locally increase the background doping at the source and drain ends of the channel, without increasing the doping in the central portion of the channel. This increased doping in the vicinity of the source/channel and drain/channel junctions may decrease the source and drain junction depletion widths at the channel edges. Such a reduction in source and drain depletion widths lessens the encroachment of the source and drain depletion regions into the area underlying the transistor gate, thereby reducing punchthrough and lessening the reduction in $V_T$ exhibited by the short-channel transistor. The more heavily-doped region at the channel ends is often called a "halo". Such halos are generally formed using angled ion implants which direct the implanted impurities below the edges of the gate conductor.

A cross-sectional view of an idealized MOSFET formed with a halo implant is shown in FIG. 4. The transistor of FIG. 4 is similar to that of FIG. 1, except that halo regions 36 are included at the source and drain ends of the transistor channel. Unlike source and drain portions 18 and 20, halo regions 36 are doped with the same impurity type as substrate 10. For an n-channel transistor, substrate 10 is p-type, and regions 36 are also p-type, and more heavily doped than substrate 10. In practice, there are several problems with the implanted halo formation of the transistor in FIG. 4. In a similar manner as described above for LDD formation, the use of ion implantation can cause structural defects which lead to enhanced diffusion of halo and source/drain impurities into the channel region. Furthermore, accurate placement of the halo regions is complicated by strong dependence of the position on factors such as implant energy, implant dose, and thickness of surface oxides. The implantation process is also very time-consuming because the wafer must be rotated in 90 degree increments between implants to allow introduction of the halo impurities below each side of the gate conductor perimeter. In addition, because the angled implants are directed toward the sidewalls of the gate conductor, damage to the gate conductor may result.

It would therefore be desirable to develop a method for reducing diffusion of source/drain features such as LDD regions and halos. The desired method should allow accurate placement of source/drain regions and should not cause increased resistances in the transistor.

SUMMARY OF THE INVENTION

The problems outlined above are in large part addressed by epitaxial growth of source and drain regions which include lower-bandgap portions. A gate conductor is formed over a gate dielectric on a semiconductor substrate. The gate conductor is covered on all sides with oxide or another dielectric for protection during subsequent processing. Anisotropic etching is used to form shallow trenches in the substrate on either side of the gate conductor. The trenches are bounded by the dielectric-coated gate conductor and by dielectric isolation regions, or by an adjacent gate conductor in the case of non-isolated transistors. A selective epitaxy technique is then used to grow within each trench a layer of a material having a bandgap lower than that of the semiconductor substrate. The lower-bandgap material is preferably grown only on the exposed semiconductor surfaces in the trenches, and not on the surrounding dielectric regions.

Every semiconductor material has a characteristic energy gap, or "bandgap", between the energies of electrons participating in bonding between the atoms which form the semiconductor, and the energies of electrons which are free to move about the material in response to applied fields. The semiconductor substrate for the method recited herein is preferably a silicon substrate, and the lower-bandgap material is preferably a silicon-germanium alloy (SiGe). This combination of materials will be used hereinafter to describe the method and transistor recited herein. The method may also be applicable to other semiconductor combinations, however, such as the use of a gallium arsenide substrate with a lower-bandgap material made from an indium gallium arsenide alloy.

Transistors have been previously formed in SiGe epitaxial layers grown on silicon substrates. Such transistors are generally formed by growing a SiGe layer on a silicon substrate, forming a gate conductor over the epitaxial layer, and forming source and drain regions self-aligned to the gate conductor. However, these transistors suffer from limitations associated with having the transistor channel within the SiGe. Because the lattice spacing for SiGe is larger than that for silicon, the SiGe layer either deforms so that the atoms in the SiGe alloy are aligned with those of the underlying silicon (if the SiGe layer is relatively thin), or becomes dislocated, wherein some rows of atoms in the silicon and/or the SiGe are not properly bonded to surrounding atoms (when the SiGe is thicker). Both of these states may be disadvantageous for transistor operation. For example, the lattice deformation by which thin SiGe layers align with an underlying silicon substrate changes the transport properties of the charge carriers which comprise the current along the channel during transistor operation. For p-channel devices, this change in transport properties may increase the transistor drive current and speed, but for n-channel devices the lattice deformation is believed to cause a degradation of transistor properties. If a SiGe layer is made thick enough that dislocations form, on the other hand, transistor performance may be degraded because the dislocations act as defects which can increase the resistance of the channel and/or reduce the speed of the device by trapping charge carriers. The above limitations may similarly apply in other cases for which a transistor is formed within a lower-bandgap layer formed on a semiconductor substrate, because most such materials systems also involve materials with mismatched lattice spacings.

Use of SiGe in the source/drain regions, but not the channel, of the transistor as recited herein does not share the disadvantages described above. Because the source/drain regions are relatively heavily-doped low-resistance regions, lattice distortion and/or dislocation formation have little effect on charge carrier transport in these regions. In fact, the use of SiGe may afford several advantages to the source/drain regions recited herein. SiGe may be doped with boron or phosphorus to levels higher than are possible with pure Si. Higher doping levels allow lower series resistances for SiGe LDD regions, and/or narrower and more effective halo regions. The lower bandgap of SiGe as compared to silicon may also result in lowered contact resistance when SiGe is used at the upper surface of the source or drain region. Similar advantages may be realized with lower-bandgap source/drain materials in other materials systems.

The formation of epitaxial LDD and/or halo regions within trenches, as recited herein, allows very precise placement of these regions, both laterally and vertically. Because the LDD and halo regions are not formed using ion implantation, the defects associated with ion implantation are avoided, and defect-enhanced diffusion of LDD and halo regions is believed to be avoided as well. The LDD and halo regions may therefore remain closer to their initial positions than do conventional LDD and halo implants. Lowered doping and the associated increased resistance and lowered drive current are therefore not believed to be necessary. In addition to reduction of LDD and halo diffusion laterally into the channel, defect-enhanced vertical diffusion may be avoided as well. In this way, shallower junctions may be maintained in the vicinity of the channel. Shallow junctions are important for controlling depletion-region-related short channel effects such as punchthrough.

In one embodiment of the method recited herein, the SiGe grown within the trench is doped with the same carrier type as the silicon substrate, but to a higher concentration than that of the substrate. In this embodiment the SiGe layer functions as a halo. The halo layer only partially fills each trench. The remainder of the trench is filled with epitaxial SiGe or silicon, doped with a carrier type opposite to that of the substrate. For example, if an n-channel transistor is fabricated, the halo SiGe layer is p-type, and the remainder of the trench is filled with n-type SiGe or silicon. This n-type material serves as the LDD portion of the final transistor. The selective epitaxy technique used to grow the halo layer and fill the remainder of the trench provides deposition of SiGe or silicon upon exposed silicon or SiGe, but not on areas covered with a dielectric.

In an alternative embodiment, the first SiGe layer deposited into the trench is undoped. The remainder of the trench is then filled with a second layer (preferably also SiGe) which is doped with impurities of opposite type than that of the substrate. In this way, an LDD region is formed with a thin undoped buffer region between the LDD region and the channel. The undoped buffer region provides space for diffusion of dopants from the LDD region during subsequent processing. Because structural defects from ion implantation are avoided, diffusion may not be enhanced by defects and may therefore be more readily predictable. In this way, the thickness of the buffer region may be set such that the final extent of the LDD region may be close to the dimensions of the original trench. Similar undoped buffer regions may be combined with the SiGe halo and LDD regions described above.

After LDD region formation, conventional transistor fabrication may be continued by, for example, formation of sidewall spacers and ion implantation of deep source/drain regions. The LDD and/or halo region formation described above may be applied to selected transistors using masking techniques such as photoresist masking. For example, devices on a substrate for which trench formation is not desired may be covered with photoresist before the trenches are etched. For CMOS circuit formation, p-channel transistors may be masked during formation of LDD and/or halo regions for n-channel transistors, while n-channel transistors are masked during LDD and halo region formation for the p-channel transistors.

In addition to the method described above, a transistor is contemplated herein. A gate structure is dielectrically spaced over a silicon substrate. Shallow source/drain portions which include at least one SiGe layer are configured within trenches formed in the silicon substrate. The trenches are laterally displaced on either side of the gate structure. Dielectric spacers may be arranged adjacent sidewalls of the gate structure, and deep source/drain portions having opposite carrier type to that of the silicon substrate may be configured within the substrate. The deep source/drain portions are laterally displaced outward from the sidewalls of the gate structure by a distance approximately equal to the width of one of the dielectric spacers.

In one embodiment of the transistor, each of the shallow source/drain portions includes a SiGe layer doped with impurities of the same type as that of the silicon substrate. This SiGe layer is more heavily doped than the silicon substrate, and serves as a halo region to mitigate short-channel effects such as punchthrough and threshold voltage reduction. This halo SiGe layer is configured adjacent to the bottom and sidewalls of the trench. The remainder of the shallow source/drain portion is doped with impurities of opposite type to that of the halo layer and silicon substrate, such that an LDD region is formed. The LDD region may be formed from epitaxial SiGe or epitaxial silicon.

In another embodiment of the transistor, each shallow source/drain portion includes an undoped SiGe layer, which serves as a buffer layer into which adjacent dopant impurities may diffuse during subsequent processing. This buffer layer is configured adjacent to the bottom and sidewalls of the trench. The remainder of the shallow source/drain portion is doped with impurities of opposite type to that of the silicon substrate, such that an LDD region is formed. The LDD region may be formed using epitaxial SiGe or epitaxial silicon.

In further embodiments of the transistor, both halo and buffer layers may be configured within the shallow source/drain portion. For example, an undoped SiGe layer may be configured adjacent the bottom and sidewalls of the trench, with a heavily doped SiGe layer of the same carrier type as the substrate adjacent to the undoped layer. The remainder of the shallow source/drain portion may be an LDD region, so that a halo layer is arranged between the LDD region and the transistor channel, and a buffer layer to allow for diffusion is arranged between the halo and the channel. A buffer layer may alternatively be interposed between the LDD region and the halo layer, or buffer layers may be used in both positions.

BRIEF DESCRIPTION OF THE DRAWINGS

Other objects and advantages of the invention will become apparent upon reading the following detailed description and upon reference to the accompanying drawings in which.

Figure 1:
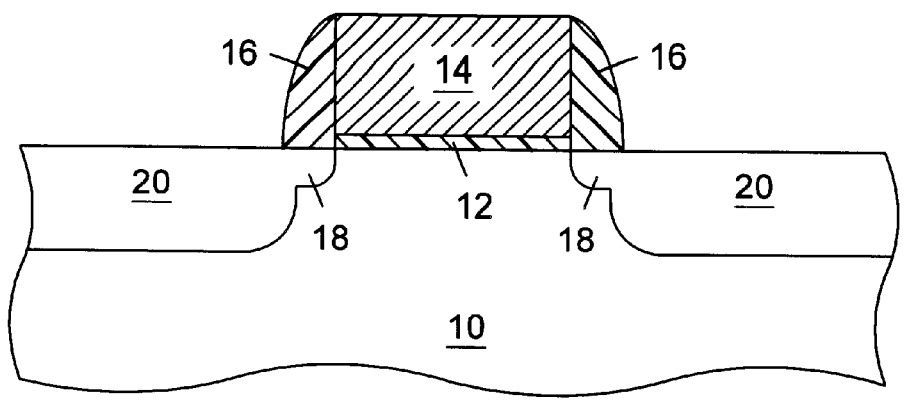
FIG. 1 is a partial cross-sectional view of a semiconductor topography including an idealized MOS transistor structure.
Figure 2:
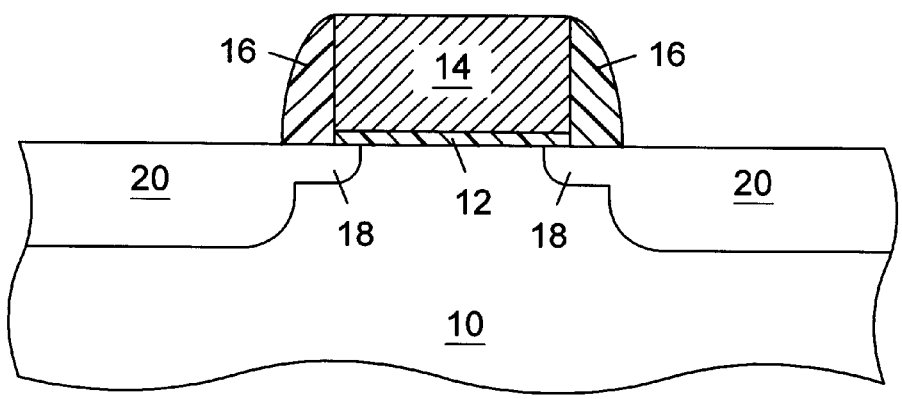
FIG. 2 is a partial cross-sectional view of the semiconductor topography illustrating the effects of diffusion on the source and drain of the MOS transistor of FIG. 1.
Figure 3:
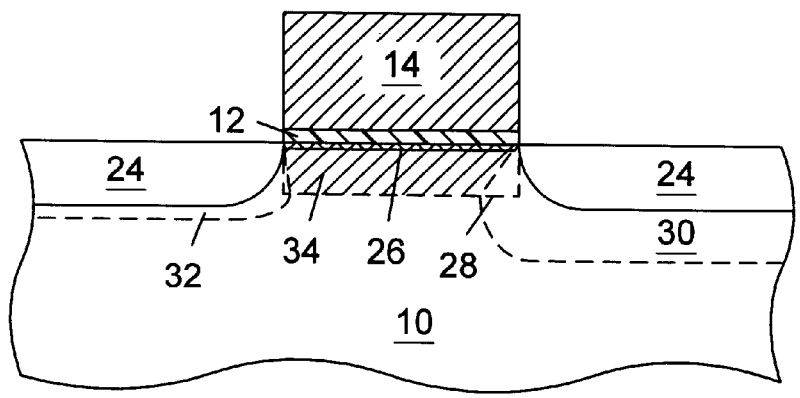
FIG. 3 is a partial cross-sectional view of a semiconductor topography including an enhancement-mode MOSFET structure biased into inversion.
Figure 4:
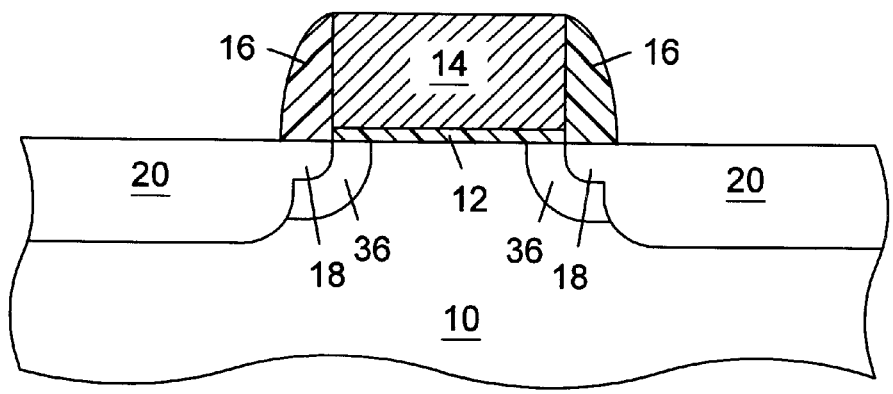
FIG. 4 is a partial cross-sectional view of a semiconductor topography including an idealized MOSFET structure with halo implants.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed. On the contrary, the intention is to cover all modifications, equivalents, and alternatives falling within the spirit and scope of the present invention.

DETAILED DESCRIPTION OF THE PREFERRED EMBODIMENTS

Figure 5:
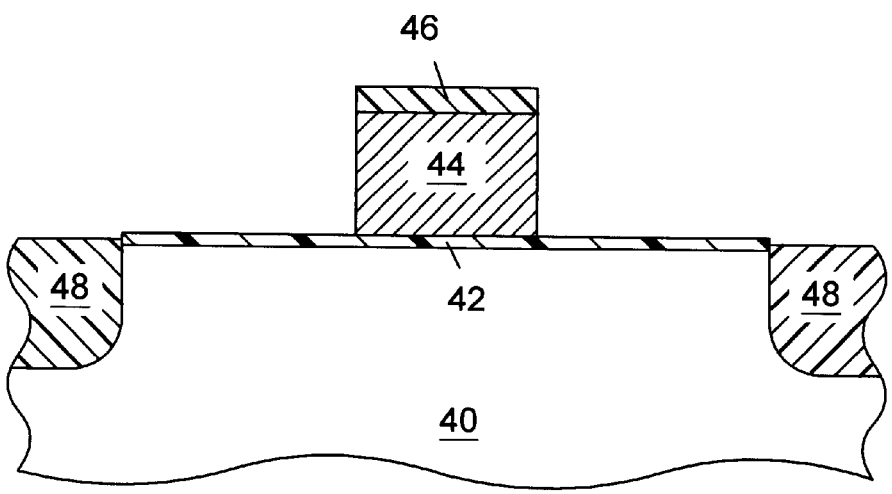
FIG. 5 is a partial cross-sectional view of a semiconductor topography according to an embodiment of the method recited herein, wherein a gate conductor is formed over a gate dielectric on a semiconductor substrate.

Turning to the drawings, FIG. 5 illustrates a partial cross-section of a semiconductor topography including gate structure 44 formed over gate dielectric 42 on semiconductor substrate 40, according to an embodiment of the process recited herein. Isolation regions 48 may be formed within substrate 40 in order to electrically isolate the subsequently-formed transistor from adjacent devices. Semiconductor substrate 40 is preferably monocrystalline silicon, and is doped either n-type or p-type. Substrate 40 may, for example, be an epitaxial silicon layer grown on a monocrystalline silicon substrate, or an n-type or p-type well region formed in a monocrystalline silicon substrate. Alternatively, substrate 40 may be an epitaxial silicon layer formed upon an insulating layer on a semiconductor substrate. Although described in terms of silicon and SiGe, the method and transistor recited herein may also be implemented using other materials systems, as noted above.

Gate dielectric 42 is preferably grown by heating substrate 40 to a temperature of greater than about 700° C. in an oxidizing ambient to grow oxide. Other gate dielectrics may be used, however, including silicon nitride ("nitride"), nitrided oxide, and silicon oxynitride ("oxynitride"). Gate dielectric 42 may also be formed by other methods, such as chemical vapor deposition (CVD). If nitride is used for gate dielectric 42, a thin pad oxide may also be formed between the nitride and the substrate. Isolation regions 48 may be formed by various methods, such as by formation of trenches which are subsequently filled with a deposited dielectric, or by local oxidation of the substrate, using nitride to mask the active regions.

Gate conductor 44 is preferably a polysilicon gate conductor patterned from a polysilicon layer which is deposited using CVD of silicon from, for example, a silane source. Such a CVD process may alternatively result in an amorphous silicon layer, particularly if low substrate temperatures are used. Such an amorphous silicon layer may also be patterned to form gate conductor 44. Subsequent high-temperature processing, such as that associated with source and drain impurity introduction, results in formation of a polysilicon gate conductor even if an amorphous silicon layer is initially deposited. The thickness of gate conductor 44 depends on the particular transistor fabrication process used, but a typical thickness may be between about 1000 angstroms and about 3000 angstroms. The gate conductor, along with any other features recited herein, may have any dimensions compatible with the desired device performance and the capabilities of the overall fabrication process.

Dielectric 46 may overlie gate conductor 44 after patterning. Dielectric 46 may be a portion of a bottom anti-reflective coating (BARC) used in patterning the gate conductor. Patterning of the gate conductor involves forming a layer of photoresist over the layer to be patterned (e.g., deposited polysilicon). The photoresist is subsequently exposed to radiation through a mask and selectively removed, or developed, to form a pattern. The remaining photoresist protects underlying material from being removed during a subsequent etching step. The photoresist is then removed, leaving the patterned gate conductor (or other feature). A BARC may be formed between a material to be patterned and the overlying photoresist used to pattern the material, in order to reduce patterning inaccuracies caused by reflection of the exposing radiation from the underlying material back up through the photoresist layer. Such reflection can cause various exposure problems. If the underlying material has a relatively rough surface, light may be reflected in directions oblique to the surface, causing exposure in areas which should be masked. For smooth underlying surfaces producing normal-incidence reflections, the reflections can result in standing waves within the photoresist during exposure, which can produce a vertical undulation of the sidewall of developed resist features. In either event, an inaccurate transfer of the mask pattern to the underlying material may result.

Figure 6:
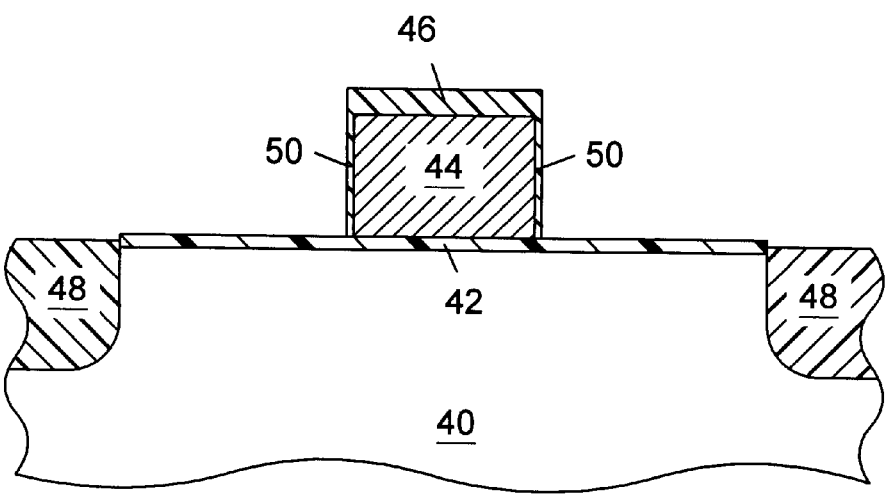
FIG. 6 is a partial cross-sectional view of the semiconductor topography, wherein exposed surfaces of the gate conductor are encapsulated with a dielectric, subsequent to the gate conductor formation of FIG. 5.

A BARC may alleviate reflection problems by various mechanisms, such as by absorbing most of the exposing radiation before it can be reflected by the material underlying the photoresist, or by creating reflections at both the top and bottom of the BARC and forming a half-wavelength path for the radiation, so that the top and bottom reflections are precisely out of phase and "cancel" each other. A useful BARC for gate dielectric patterning may be formed from silicon oxynitride (SiON). Dielectric 46 of FIG. 5 is preferably the portion of such a SiON (or other dielectric) BARC remaining after patterning of gate conductor 44 and removal of the photoresist used during patterning. This dielectric serves to protect gate conductor 44 during subsequent processing, as described further below. Exposed surfaces of gate conductor 44 are subsequently encapsulated with dielectric, as shown in FIG. 6. Dielectrics 50 over sidewalls of gate conductor 44 are preferably formed by a thermal oxidation process, such as heating the semiconductor topography to a temperature of greater than about 700° C. in an oxidizing ambient to form oxide.

Figure 7:
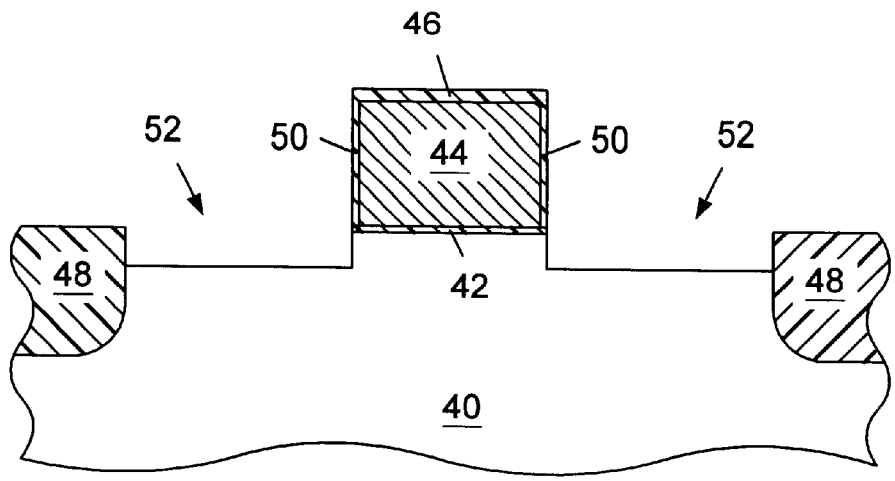
FIG. 7 is a partial cross-sectional view of the semiconductor topography, wherein trenches are formed within the semiconductor substrate on either side of the gate conductor, subsequent to the encapsulation of FIG. 6.

Turning now to FIG. 7, portions of gate dielectric 42 not covered by gate conductor 44 are removed, and trenches 52 are formed in substrate 40. The gate dielectric removal is performed using anisotropic etching in a vertical direction, so that dielectrics 50 covering sidewalls of gate conductor 44 are retained. Trenches 52 are also preferably formed using anisotropic etching, with a process that etches substrate 40 selectively over dielectrics 46 and 50 and isolation dielectrics 48. The depth of trenches 52 is approximately equal to the LDD portion thickness of the transistor to be formed, and therefore depends on the particular fabrication process. Suitable depths may include depths in a range from a few hundred angstroms to a few thousand angstroms, but any depth compatible with the desired device performance and the capabilities of the overall fabrication process may be used. The trench formation of FIG. 7 may be done without patterning steps, since gate conductor 44 is protected by dielectrics 46 and 50. Areas on other parts of substrate 40 for which etching may not be desired may be masked with photoresist before the trench formation of FIG. 7. Trenches 52 are self-aligned to sidewalls of encapsulated gate conductor 44 (specifically, to sidewalls of dielectrics 50) and extend to isolation regions 48. In embodiments for which isolation regions 48 include "bird's beak" extensions at the edges (as may occur when local oxidation is used to form isolation regions), however, the bird's beak may block etching of underlying silicon such that a small portion of substrate 40 may remain between trench 52 and isolation region 48. In embodiments for which two or more transistors are formed without isolation regions between them (as may be done for transistors to be connected in series, for example), the trenches extend between the gate conductors of adjacent transistors.

A portion of dielectric 46 may be removed during the gate dielectric removal and/or trench formation of FIG. 7, but the encapsulation of gate conductor 44 by dielectrics 46 and 50 must remain intact after the trench formation. The relative thicknesses and compositions of dielectrics 46, 50 and 42 are chosen to maintain this encapsulation. For example dielectric 46 may be formed thicker than gate dielectric 42. Additionally or alternatively, dielectric 46 may be formed from a material which etches more slowly than uncovered portions of gate dielectric 42. Use of SiON for dielectric 46 and oxide for dielectrics 42 and 50 is believed to meet these requirements, but other dielectric combinations may be suitable as well.

Figure 8:
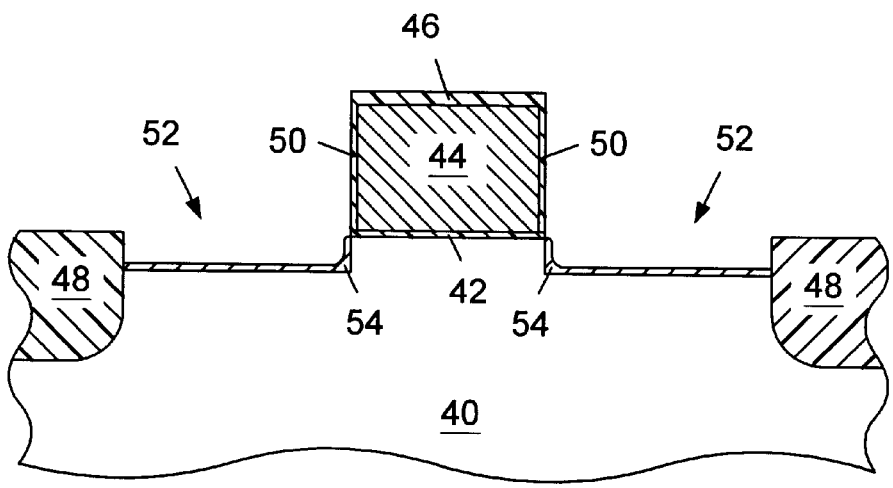
FIG. 8 is a partial cross-sectional view of the semiconductor topography, wherein a low-bandgap semiconductor layer is formed within each trench, subsequent to the trench formation of FIG. 7.

Low-bandgap semiconductor layer 54, preferably a SiGe alloy layer, is formed within each of trenches 52, as shown in FIG. 8. "Low-bandgap" (or "lower-bandgap") as used herein refers to a semiconductor material having a bandgap lower than that of semiconductor substrate 40. Layer 54 is preferably a monocrystalline layer epitaxially grown on exposed semiconductor surfaces within trench 52. Epitaxial growth refers to growth of a crystalline material upon another crystalline material, where the regular atomic arrangement of the underlying crystal acts as a template for arrangement of atoms in the grown layer. The surface of the underlying crystalline material must generally be clean and well-ordered for a high-quality epitaxial layer to be grown. A cleaning procedure may therefore be necessary before growth of layer 54, to remove any contaminants associated with formation of trenches 52. Suitable cleaning procedures may include variants of the widely used "RCA method" (formulated by Kern and Puotinen at RCA Laboratories) for cleaning Si. Such a cleaning may include, for example, use of a 5:1:1 solution of $H_2O:NH_4OH:H_2O_2$ followed by a deionized water rinse for removal of organic and metallic contaminants, followed by use of hydrofluoric acid to remove residual oxides. Any photoresist used for masking other areas of substrate 40 during the trench formation of FIG. 7 is removed before formation of layer 54. The dielectric encapsulation performed as shown in FIG. 6 protects all surfaces on substrate 40 except those of trenches 52 from the layer growth of FIG. 8.

Growth of layer 54 is preferably upon exposed semiconductor surfaces within trenches 52 and not upon the surrounding dielectric surfaces. Such selective growth is commonly termed "selective epitaxy". As an example, selective epitaxy of a SiGe alloy may be achieved by CVD using gaseous silane ($SiH_4$), germane ($GeH_4$) and hydrochloric acid (HCl) precursors. Such growth may be performed at temperatures from about 400° C. to about 700° C. using various commercially-available CVD reactors. The selectivity generally arises from a competition between growth and etching in the CVD reactions, and from faster epitaxial growth rates of semiconductors on crystalline semiconductor surfaces as compared to amorphous dielectric surfaces. The presence of a suitable amount of HCl in the above example is believed to provide simultaneous etching during epitaxial growth. Growth upon semiconductor surfaces is rapid enough to overcome the etching, but growth upon dielectric surfaces proceeds slowly enough that etching of any deposited material dominates.

Selective epitaxy using other techniques, such as molecular beam epitaxy (MBE), may also be suitable for deposition of layer 54. In MBE growth of a SiGe alloy, atoms of silicon and germanium from evaporation sources are directed toward a heated substrate, and thermal energy allows rearrangement of the impinging atoms to form a monocrystalline layer. Although MBE growth is not routinely selective, under appropriate combinations of substrate temperature and impinging atom flux, the impinging semiconductor atoms may "stick" to semiconductor surfaces and not to dielectric surfaces, resulting in selective epitaxy within the trenches. Under conditions for which epitaxy is not selective, filling of the trenches may alternatively be accomplished by depositing layer 54 within trenches 52 and over the surrounding surfaces, and then removing portions of layer 54 external to trenches 52. In one embodiment, such removal involves forming a mask to protect trenches 52 while portions of layer 54 overlying the surrounding dielectric surfaces are etched away, and subsequently removing the mask.

Figure 9:
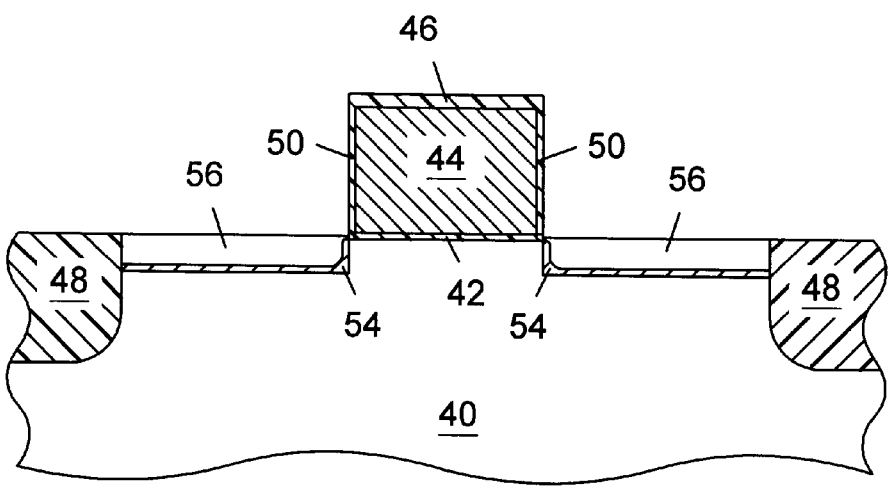
FIG. 9 is a partial cross-sectional view of the semiconductor topography, wherein a semiconductor material is deposited to fill the trench, subsequent to the low-bandgap layer formation of FIG. 8.

Remaining portions of trenches 52 may then be filled with semiconductor portions 56, as shown in FIG. 9. Semiconductor portions 56 are preferably formed from a silicon-germanium alloy grown by selective epitaxy in the manner described above. Portions 56 act as LDD portions of subsequently-formed transistor source/drain regions. Portions 56 are therefore doped with a carrier type opposite to that of semiconductor substrate 40. For an n-channel transistor, for example, substrate 40 is p-type and semiconductor portions 56 are n-type. Boron is a typical p-type dopant in silicon or SiGe, and may be incorporated during CVD epitaxial growth using diborane ($B_2H_6$) gas. N-type dopants include arsenic, phosphorus, and antimony. Arsenic and phosphorus may be incorporated during CVD epitaxial growth using arsine ($AsH_3$) and phosphine ($PH_3$) gases, respectively. In an embodiment in which portions 56 are deposited by molecular beam epitaxy, antimony doping may be achieved by co-evaporation from a solid antimony source. Use of SiGe for semiconductor portions 56 provides a lower-bandgap material at the upper surfaces of the source/drain regions of the subsequently-formed transistor. Such a lower-bandgap material at the upper surface is believed to be advantageous in facilitating low-resistance ohmic contacts to the source/drain regions, since the potential barriers associated with metal-semiconductor contacts are generally lower when lower-bandgap semiconductors are used. Portions 56 may also be formed from silicon, however. Use of silicon may be desirable in embodiments for which it is desirable to avoid dislocations which may result from growth of a relatively thick SiGe layer on silicon. Because the SiGe is grown within source/drain regions which are relatively heavily-doped, low-resistance parts of the transistor, however, such dislocations are not believed to present a significant limitation to transistor performance.

In one embodiment of the structure of FIGS. 8 and 9, low-bandgap layer 54 is grown undoped, or not intentionally doped. Some "background" level of doping associated with the deposition system and process may occur, but this doping level is believed to be small (e.g., less than about $10^{16}$ cm$^{-3}$). In this embodiment, layer 54 acts as a "buffer" region between the transistor channel region underlying gate conductor 44 and the doped LDD portions 56 subsequently formed within trenches 52 adjacent layer 54. This buffer region provides space for diffusion of dopants from portions 56 during subsequent processing. Because structural defects from ion implantation are avoided by the LDD portion growth of FIGS. 8 and 9, this diffusion may not be enhanced by defects and may therefore be more readily predictable. In this way, the thickness of layer 54 may be set such that the final extent of the LDD region may be close to the dimensions of trench 52, and excessive shortening of the transistor channel due to diffusion may be avoided. Such increased control over diffusion of the LDD dopants may allow a higher LDD doping to be used, thereby lowering series resistance and increasing transistor drive current.

In an alternative embodiment of the structure, layer 54 is grown heavily-doped, having a carrier type the same as that of substrate 40. In this embodiment, layer 54 acts as a "halo" layer, to reduce the extent of depletion regions associated with the channel/drain and channel/source p-n junctions. This reduction of depletion region extent may have benefits including reduction of punchthrough and reduction of $V_T$-lowering in short channel devices. Use of a grown halo layer such as layer 54 is believed to be advantageous as compared to conventional implanted halo layers for many reasons. For example, the enhanced diffusion associated with implantation damage at the ends of the channel may be avoided. Implantation damage to the sidewalls of the gate conductor which may be caused by angled implants is also avoided. Furthermore, the grown halo layer recited herein may be placed more precisely than an implanted halo, and the time-consuming rotation of the wafer to achieve multiple implant directions is avoided.

Figure 10:
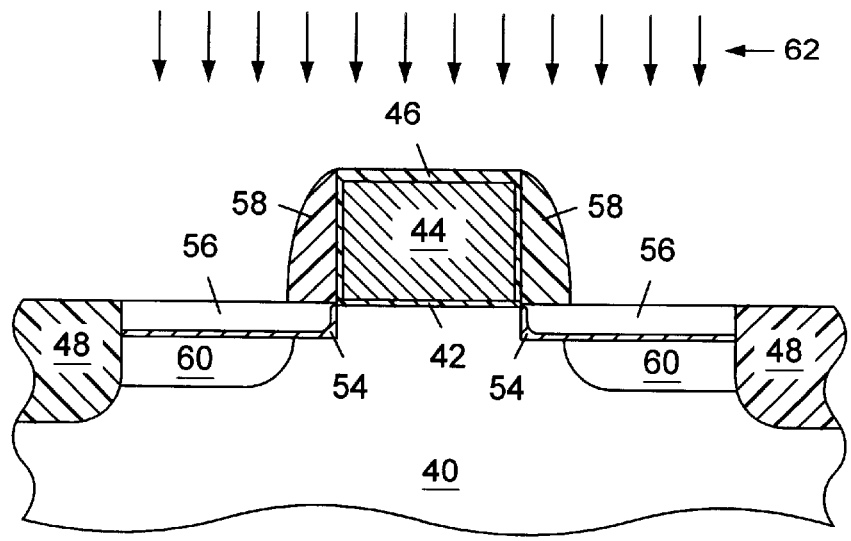
FIG. 10 is a partial cross-sectional view of the semiconductor topography, wherein dielectric spacers are formed adjacent sidewalls of the gate conductor and deep source/drain portions are formed, subsequent to the trench fill of FIG. 9.

For any of the embodiments described above, the structure of FIG. 9 may be subjected to further transistor formation, as shown in FIG. 10. Dielectric spacers 58 may be formed adjacent to sidewalls of encapsulated gate conductor 44, and deep source/drain portions 60 may be formed using impurity introduction 62. Spacers 58 are preferably formed by depositing a conformal dielectric layer over gate conductor 44 and substrate 40, and anisotropically etching the dielectric layer to leave spacers 58. The spacers may be formed from various dielectrics, including oxide, nitride, and oxynitride. Impurity introduction 62 is preferably an ion implantation process, by which deep source/drain portions 60 are formed self-aligned to exposed lateral surfaces of spacers 58. Deep source/drain portions 60, like LDD portions 56, are doped to have opposite carrier type to that of semiconductor substrate 40. Portions 60 typically extend farther into substrate 40 than portions 56, to facilitate contact and/or silicide formation to the source/drain regions. Portions 60 are also typically somewhat more heavily doped than portions 56. An anneal is performed after implantation of portions 60 in order to activate the impurities and repair damage to substrate 40.

The specific composition of any SiGe alloys used in the process of FIGS. 8–10 depends on the amount of bandgap-lowering desired. Some disadvantages may be associated with high germanium concentrations, however, such as possible difficulty forming a silicide contact upon the SiGe alloy. An alloy containing about 30% germanium is believed to be an example of a suitable composition. The thickness of low-bandgap layer 54 may be adjusted depending on the expected diffusion distances (if used as an undoped buffer region) or depletion region widths (if used as a halo). The use of epitaxial growth typically allows precise control of thicknesses as small as about ten angstroms. As an example, a thickness in a range from a few tens of angstroms to a few hundreds of angstroms may be suitable.

Figure 11:
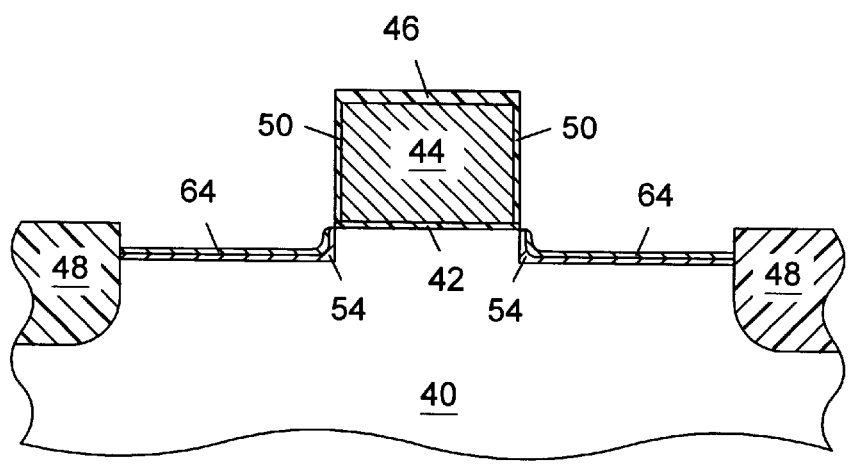
FIG. 11 is a partial cross-sectional view of the semiconductor topography according to an alternative embodiment, wherein a second low-bandgap layer is formed within the trench, subsequent to the low-bandgap layer formation of FIG. 8.

Turning now to FIG. 11, a semiconductor topography according to an alternative embodiment is shown. Low-bandgap layer 64 is formed within each of trenches 52, subsequent to formation of layer 54 as shown in FIG. 8. Layer 64 is formed in a manner similar to formation of layer 54 as described above, except that the two layers are doped differently. In embodiments for which layer 54 is undoped, layer 64 is heavily doped and of the same carrier type as substrate 40. Layer 54 therefore serves as a buffer for diffusion of heavily-doped halo layer 64 into the transistor channel underlying gate conductor 44. In embodiments for which layer 54 is a heavily doped halo layer, on the other hand, layer 64 is undoped. In these embodiments, layer 64 serves as a buffer for interdiffusion between dopants from halo layer 54 and those from the subsequently-formed LDD portions of the source/drain regions.

Figure 12:
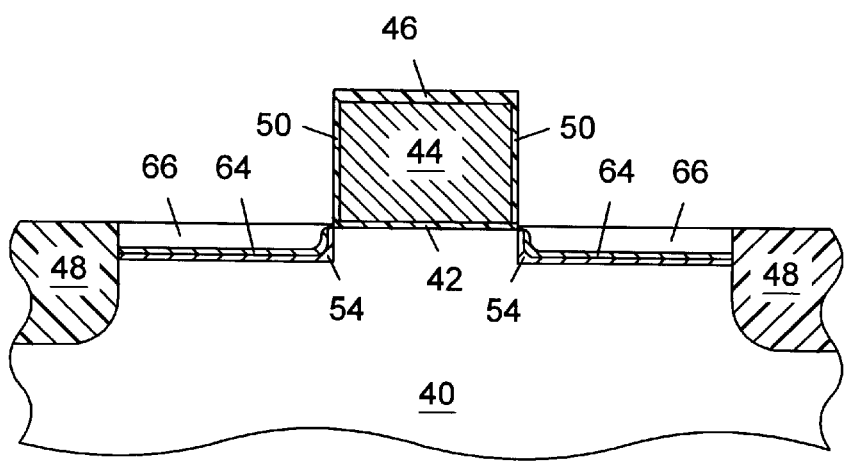
FIG. 12 is a partial cross-sectional view of the semiconductor topography, wherein a semiconductor material is deposited to fill the trench, subsequent to the second low-bandgap layer formation of FIG. 11.
Figure 13:
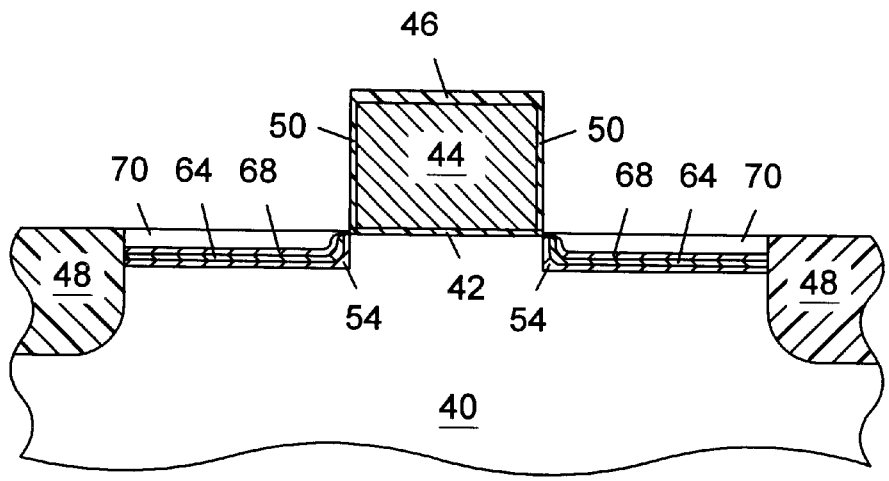
FIG. 13 is a partial cross-sectional view of the semiconductor topography according to an alternative embodiment, wherein a third low-bandgap layer is formed and a semiconductor material is deposited to fill the trench, subsequent to the low-bandgap layer formation of FIG. 8.

Remaining portions of trenches 52 may then be filled with semiconductor portions 66, as shown in FIG. 12. Portions 66 are similar in composition and formation to portions 56 of FIG. 9, and form LDD portions of the transistor. The structure of FIG. 12 is similar to that of FIG. 9, except that the undoped buffer layer and heavily-doped halo layer are combined in the structure of FIG. 12. Transistor fabrication may be continued using the structure of FIG. 12, in a manner similar to that shown in FIG. 10. Another alternative embodiment combining an undoped diffusion buffer layer and a heavily-doped halo layer is shown in FIG. 13. In the embodiment of FIG. 13, low-bandgap layer 54 is an undoped diffusion buffer layer, layer 64 is a heavily-doped halo layer, and additional low-bandgap layer 68 is grown subsequent to the growth of layer 64 shown in FIG. 11. Layer 68 is an undoped layer similar to layer 54, so that heavily doped halo layer 64 has a diffusion buffer layer on either side. LDD portion 70 is similar to portions 66 and 56 of FIGS. 12 and 9, respectively.

Figure 14:
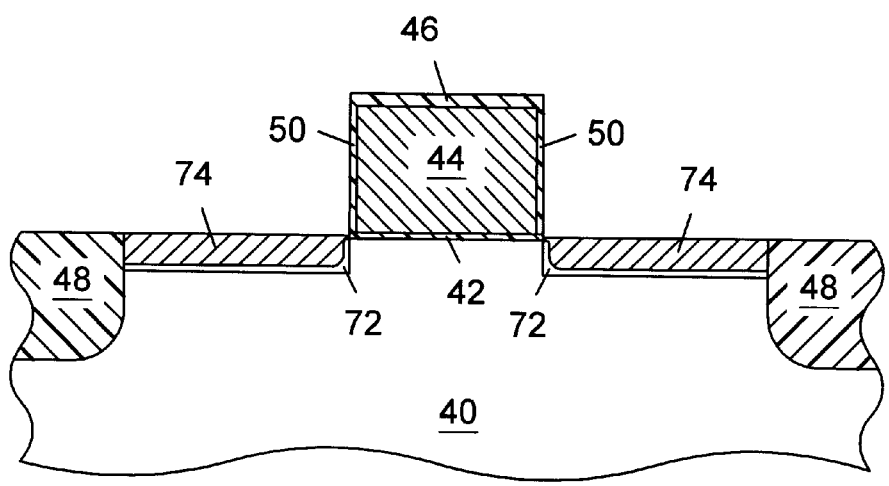
FIG. 14 is a partial cross-sectional view of the semiconductor topography according to an alternative embodiment, wherein a low-bandgap material is formed over a higher-bandgap material to fill the trenches, subsequent to the trench formation of FIG. 7.
Figure 15:
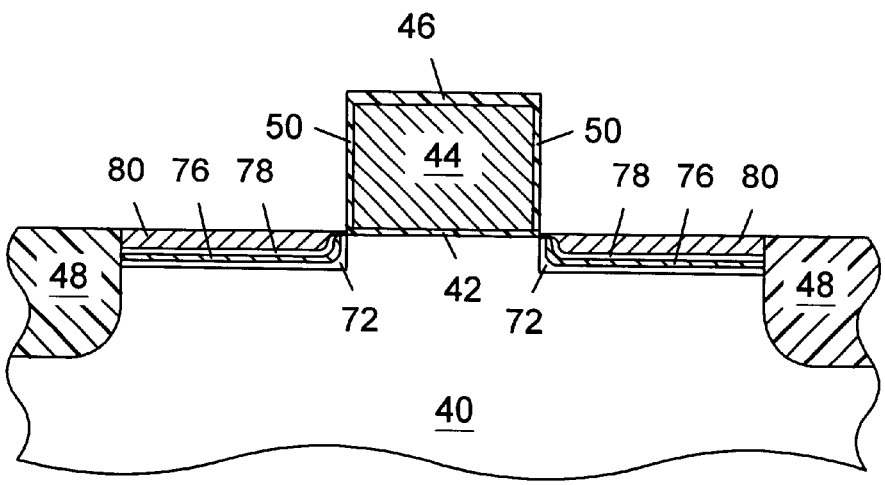
FIG. 15 is a partial cross-sectional view of the semiconductor topography according to an alternative embodiment, wherein the trenches are filled using a low-bandgap material formed over a layer structure including a low-bandgap layer between two higher-bandgap layers, subsequent to the trench formation of FIG. 7.

A structure according to another alternative embodiment is shown in FIG. 14. Instead of low-bandgap layer 54, layer 72, preferably a silicon layer, is formed within each of trenches 52, subsequent to the trench formation of FIG. 7. The remainder of each trench is filled with low-bandgap material 74, preferably SiGe. Layer 72 is undoped, to serve as a diffusion buffer between substrate 40 and material 74, which is doped to form an LDD region of opposite type than substrate 40. Because layer 72 is undoped in this embodiment, the higher doping levels which may be achievable by using SiGe for this layer may not be needed. Use of SiGe for LDD region 74, however, may be advantageous for allowing lowered resistance of subsequently-formed contacts to the source/drain regions. In another embodiment shown in FIG. 15, low-bandgap (preferably SiGe) heavily-doped halo layer 76 is formed over undoped layer 72. A second undoped layer 78, preferably a silicon layer, is formed over layer 76, and the remainder of the trench is filled with low-bandgap portion 80. Heavily-doped halo layer 76 may benefit from the increased doping levels attainable using SiGe, and from the undoped diffusion buffer regions formed on either side of it.

It will be appreciated to those skilled in the art having the benefit of this disclosure that this invention is believed to provide a method for forming controllable, high-performance short-channel transistors using source/drain regions which include low-bandgap portions. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A transistor, comprising:
   a gate conductor dielectrically spaced above a semiconductor substrate; and
   a pair of source/drain regions within the semiconductor substrate, laterally displaced on either side of the gate conductor, wherein each of the pair of source/drain regions comprises a filled trench, wherein the filled trench comprises a first semiconductor material having a bandgap smaller than that of the semiconductor substrate, and wherein said first semiconductor material has a carrier type the same as that of the semiconductor substrate.

2. The transistor as recited in claim 1, wherein said semiconductor substrate comprises a silicon substrate and said first semiconductor material comprises a silicon-germanium alloy.

3. The transistor as recited in claim 1, wherein said filled trench further comprises a second semiconductor material extending to an upper surface of said trench, and wherein said second semiconductor material has a carrier type opposite to that of the semiconductor substrate.

4. The transistor as recited in claim 3, wherein said first semiconductor material is more heavily doped than the semiconductor substrate.

5. The transistor as recited in claim 4, wherein said filled trench further comprises a third semiconductor material adjacent the first semiconductor material, wherein the third semiconductor material has a bandgap smaller than that of the semiconductor substrate and is substantially undoped.

6. The transistor as recited in claim 5, wherein said third semiconductor material is interposed between the first semiconductor material and the second semiconductor material.

7. The transistor as recited in claim 5, wherein said third semiconductor material is interposed between the first semiconductor material and the semiconductor substrate.

8. The transistor as recited in claim 7, further comprising a fourth semiconductor material interposed between the first semiconductor material and the second semiconductor material.

9. The transistor as recited in claim 1, further comprising dielectric materials encapsulating exterior surfaces of the gate structure.

10. The transistor as recited in claim 9, wherein said dielectric material upon a top surface of the gate conductor comprises a bottom anti-reflective coating.

11. The transistor as recited in claim 2, wherein said first semiconductor material is grown by selective epitaxy.

12. The transistor as recited in claim 3, wherein said second semiconductor material has a smaller bandgap than that of the semiconductor substrate.

13. The transistor as recited in claim 3, wherein said second semiconductor material is silicon.

14. The transistor as recited in claim 8, wherein said fourth semiconductor material has a bandgap smaller than that of the semiconductor substrate.

15. The transistor as recited in claim 8, wherein said fourth semiconductor material is substantially undoped.

16. A transistor, comprising:
a gate conductor dielectrically spaced above a semiconductor substrate; and
a pair of source/drain regions within the semiconductor substrate, laterally displaced on either side of the gate conductor, wherein each of the pair of source/drain regions comprises a filled trench, and wherein the filled trench comprises:
a silicon layer adjacent to said semiconductor substrate, wherein said silicon layer is substantially undoped;
a second semiconductor material having a bandgap smaller than that of the semiconductor substrate, wherein said second semiconductor material is more heavily doped than the semiconductor substrate, and wherein said second semiconductor material is adjacent to said silicon layer;
a third semiconductor material adjacent to said second semiconductor material, wherein said third semiconductor material is substantially undoped; and
a fourth semiconductor material having a bandgap smaller than that of the semiconductor substrate, wherein said fourth semiconductor material is adjacent to said third semiconductor material.

17. The transistor as recited in claim 16, further comprising dielectric materials encapsulating exterior surfaces of the gate structure.

18. The transistor as recited in claim 17 wherein said dielectric material upon a top surface of the gate conductor comprises a bottom anti-reflective coating.

* * * * *